United States Patent
Mitsuoka et al.

(10) Patent No.: US 10,115,609 B2
(45) Date of Patent: Oct. 30, 2018

(54) SEPARATION AND REGENERATION APPARATUS AND SUBSTRATE PROCESSING APPARATUS

(71) Applicant: Tokyo Electron Limited, Tokyo (JP)

(72) Inventors: Kazuyuki Mitsuoka, Yamanashi (JP);
Hiroki Ohno, Yamanashi (JP);
Takehiko Orii, Yamanashi (JP);
Takayuki Toshima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 245 days.

(21) Appl. No.: 14/644,458

(22) Filed: Mar. 11, 2015

(65) Prior Publication Data

US 2015/0258465 A1    Sep. 17, 2015

(30) Foreign Application Priority Data

Mar. 13, 2014   (JP) .................................. 2014-050880

(51) Int. Cl.
*H01L 21/67* (2006.01)
*H01L 21/02* (2006.01)

(52) U.S. Cl.
CPC .. *H01L 21/67017* (2013.01); *H01L 21/02057* (2013.01); *H01L 21/02101* (2013.01)

(58) Field of Classification Search
CPC ............................ H01L 21/02101; B08B 3/14
See application file for complete search history.

(56) References Cited

U.S. PATENT DOCUMENTS

| | | | | |
|---|---|---|---|---|
| 4,917,770 A | * | 4/1990 | Asbury | B01D 1/0082 202/176 |
| 2004/0011386 A1 | * | 1/2004 | Seghal | G03F 7/422 134/26 |
| 2004/0244818 A1 | * | 12/2004 | Fury | B08B 7/0021 134/2 |
| 2009/0048471 A1 | * | 2/2009 | Ii | C07C 29/149 568/884 |
| 2012/0132230 A1 | * | 5/2012 | Toshima | H01L 21/67017 134/19 |
| 2015/0206773 A1 | * | 7/2015 | Hayashi | H01L 21/02101 134/30 |

FOREIGN PATENT DOCUMENTS

JP      2011-187570 A    9/2011

* cited by examiner

*Primary Examiner* — Spencer E Bell
(74) *Attorney, Agent, or Firm* — Abelman, Frayne & Schwab

(57) ABSTRACT

Disclosed is a separation and regeneration apparatus including: a supercritical processing unit configured to generate a mixed gas including a first fluorine-containing organic solvent having a first boiling point and a second fluorine-containing organic solvent having a second boiling point lower than the first boiling point; and a distillation tank configured to store hot water having a temperature between the first boiling point and the second boiling point, in which the mixed gas is input into the hot water to be separated into the first fluorine-containing organic solvent in a liquid state and the second fluorine-containing organic solvent in a gas state, in which an introduction line configured to guide the mixed gas from the supercritical processing unit to the distillation tank is provided and a distal end of the introduction line is disposed in the hot water.

8 Claims, 7 Drawing Sheets

SEPARATION AND REGENERATION APPARATUS AND SUBSTRATE PROCESSING APPARATUS

CROSS-REFERENCE TO RELATED APPLICATIONS

This application is based on and claims priority from Japanese Patent Application No. 2014-050880, filed on Mar. 13, 2014, with the Japan Patent Office, the disclosure of which is incorporated herein in its entirety by reference.

TECHNICAL FIELD

The present disclosure relates to a separation and regeneration apparatus and a substrate processing apparatus used to remove a liquid attached to the surface of a substrate by using a high-pressure fluid in a supercritical state or a subcritical state.

BACKGROUND

In a fabricating process of a semiconductor device in which a lamination structure of an integrated circuit is formed on a surface of a semiconductor wafer (hereinafter, referred to as a "wafer") which is a substrate, a liquid processing process is provided to process the wafer surface using a liquid, in which for example, minute dust or a natural oxide film on the wafer surface is removed with a cleaning liquid such as, for example, a chemical liquid.

However, with high integration of the semiconductor device, when, for example, the liquid attached to the surface of the wafer is removed in the liquid processing process, a phenomenon so-called a pattern collapse becomes problematic. The pattern collapse refers to a phenomenon in which, when the liquid remaining on the wafer surface is dried, the liquid remaining at left and right sides of, for example, a convex (that is, inside of a concave) of an unevenness forming a pattern is unevenly dried, and then a balance of surface tensions that draw the convex from side to side is lost, and thus, the convex collapses in a direction in which the liquid remains in a large amount.

As a technique for removing the liquid attached to the wafer surface while suppressing occurrence of the pattern collapse, a method using a fluid in a supercritical state or a subcritical state (hereinafter, the states are integrally referred to as a "high-pressure state") has been known. The fluid (high-pressure fluid) in the high-pressure state is lower in viscosity and higher in capability of extracting the liquid than the liquid. In addition, no interface exists between the high-pressure fluid and the liquid or gas which is in an equilibrium state to the high-pressure fluid. Therefore, when the liquid attached to the wafer surface is substituted with the high-pressure fluid and thereafter, the state of the high-pressure fluid is changed to a gas state, the liquid may be dried without being influenced by the surface tension.

The applicant has developed a liquid processing apparatus that performs a liquid processing using a single wafer-type liquid processing unit configured to supply a processing liquid to a surface of a wafer which rotates and thereafter, conveys the wafer of which the surface is covered with a dry prevention liquid to a high-pressure fluid processing unit, and removes the dry prevention liquid in a processing container. For example, in terms of high replaceability between the liquid and the high-pressure fluid and suppression of inflow of moisture in the liquid processing, Japanese Patent Laid-Open Publication No. 2011-187570 uses hydrofluoro ether (HFE) which is a fluorine-containing organic solvent (described as "fluorine compound" in Japanese Patent Laid-Open Publication No. 2011-187570) for both the dry prevention liquid and the high-pressure fluid. Further, the fluorine-containing organic solvent is suitable for the dry prevention liquid in terms of its flame-retardancy.

Meanwhile, the fluorine-containing organic solvent such as, for example, HFE, hydrofluoro carbon (HFC), perfluoro carbon (PFC), or perfluoro ether (PPE) is more expensive than, for example, isopropyl alcohol (IPA) and a volatile loss during wafer conveyance causes an increase in an operation cost. As a result, after the fluorine-containing organic solvent is used as the dry prevention liquid or the high-pressure fluid, when a mixed gas of the fluorine containing organic solvent is generated and is used through separation and regeneration, the operation cost may be reduced.

In this case, fluorine ions (F ions) may be incorporated in the mixed gas. When the F ions remain in the mixed gas, particles occur on the wafer by the F ions at the time of regenerating and using the fluorine-containing organic solvent.

SUMMARY

The present disclosure provides a separation and regeneration apparatus including: a mixed gas generating unit configured to generate a mixed gas including a first fluorine-containing organic solvent having a first boiling point and a second fluorine-containing organic solvent having a second boiling point lower than the first boiling point; and a distillation tank configured to store hot water having a temperature between the first boiling point and the second boiling point, in which the mixed gas is input into the hot water to be separated into the first fluorine-containing organic solvent in a liquid state and the second fluorine-containing organic solvent in a gas state, in which an introduction line configured to guide the mixed gas from the mixed gas generating unit to the distillation tank is provided and a distal end of the introduction line is disposed in the hot water to remove F ions in the mixed gas The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
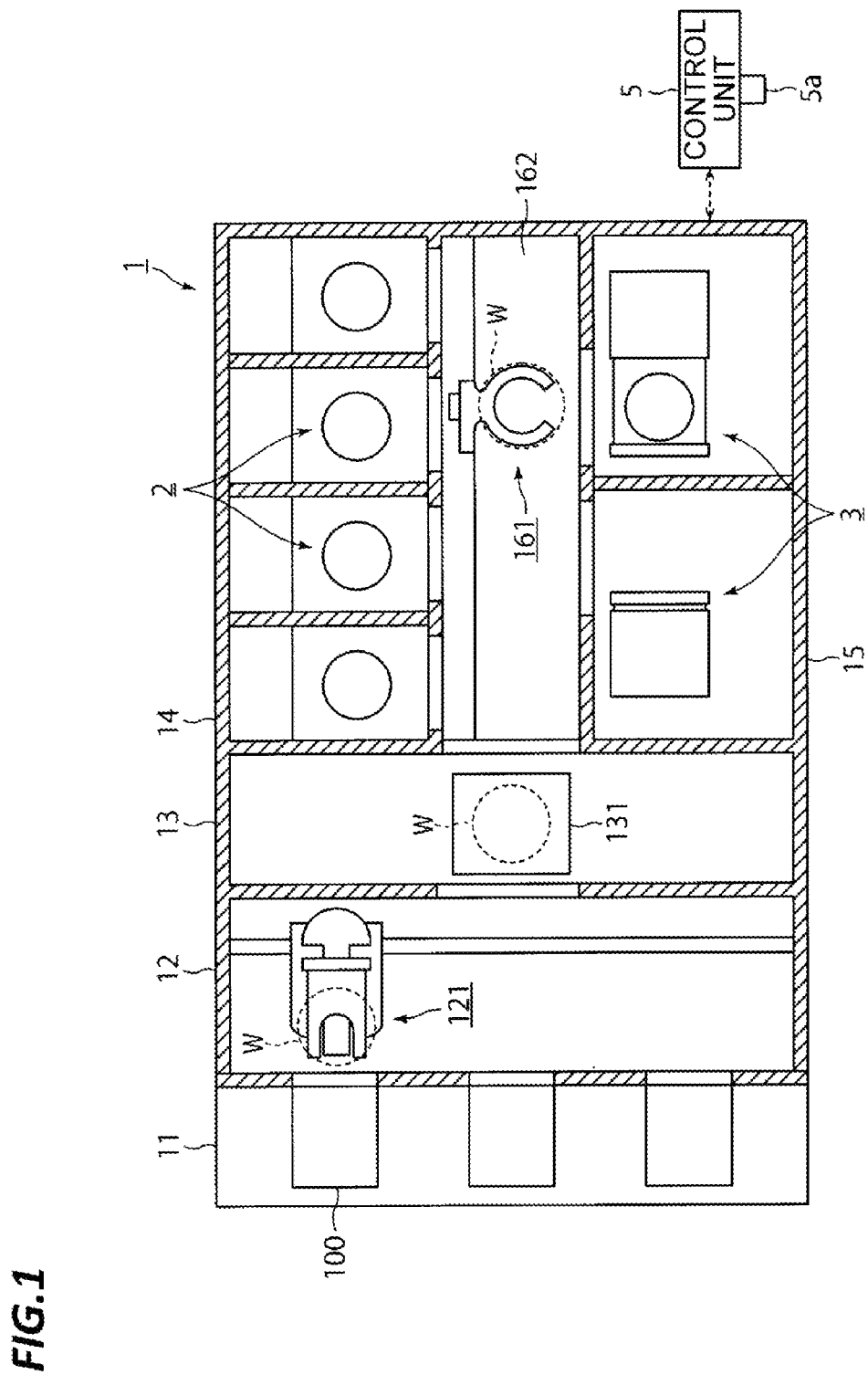
FIG. 1 is a horizontal plan view of a liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure was made in consideration of the problems described above and an object of the present disclosure is to provide a separation and regeneration apparatus and a substrate processing apparatus in which a fluorine-containing organic solvent used for removing a liquid attached to the surface of a processing target object is used through separation and regeneration, and thus a reduction of an operation cost is achieved, and particles do not occur on the processing target object.

According to an aspect of the present disclosure, a separation and regeneration apparatus includes: a mixed gas generating unit configured to generate a mixed gas including a first fluorine-containing organic solvent having a first boiling point and a second fluorine-containing organic solvent having a second boiling point lower than the first boiling point; and a distillation tank configured to store hot water having a temperature between the first boiling point and the second boiling point, in which the mixed gas is input into the hot water to be separated into the first fluorine-containing organic solvent in a liquid state and the second fluorine-containing organic solvent in a gas state, in which an introduction line configured to guide the mixed gas from the mixed gas generating unit to the distillation tank is provided and a distal end of the introduction line is disposed in the hot water to remove F ions in the mixed gas.

The separation and regeneration apparatus further includes: a first tank configured to store the first fluorine-containing organic solvent from the distillation tank; and a second tank configured to liquefy and store the second fluorine-containing organic solvent from the distillation tank.

In the separation and regeneration apparatus, the second tank accommodates a water cover configured to cover the second fluorine-containing organic solvent.

In the separation and regeneration apparatus, a first oil-water separator and a second oil-water separator are connected to the first tank and the second tank, respectively.

In the separation and regeneration apparatus, the mixed gas generating unit includes a supercritical processing unit configured to perform a supercritical processing on a processing target object.

According to another aspect of the present disclosure, a substrate processing apparatus includes: a liquid processing unit configured to supply a first fluorine-containing organic solvent having a first boiling point to a processing target object to perform a liquid processing; a supercritical processing unit configured to bring a liquid of the first fluorine-containing organic solvent attached to the processing target object after the liquid processing into contact with a supercritical fluid of a second fluorine-containing organic solvent having a second boiling point lower than the first boiling point to remove the liquid; and a substrate conveyance unit configured to convey the processing target object which has been subjected to the liquid processing in the liquid processing unit to the supercritical processing unit, in which the separation and regeneration apparatus described above is included in the supercritical processing unit.

According to an aspect of the present disclosure, it is possible to certainly remove the liquid attached to the surface of the processing target object, so that a pattern collapse may be suppressed, the reduction of the operation cost may be achieved, and the particles may be suppressed from occurring on the processing target object.

<Substrate Processing Apparatus>

First, a substrate processing apparatus embedded with a separation and regeneration apparatus according to the present disclosure will be described.

As one example of the substrate processing apparatus, a liquid processing apparatus 1 will be described, which includes a liquid processing unit 2 configured to perform a liquid processing by supplying various processing liquids to a wafer W (a processing target object) which is a substrate and a supercritical processing unit (high-pressure fluid processing unit) 3 configured to remove a dry prevention liquid, which is attached on the wafer W after the liquid processing, by bringing the dry prevention liquid into contact with a supercritical fluid (high-pressure fluid).

FIG. 1 is a horizontal plan view illustrating an overall configuration of the liquid processing apparatus 1. A left side of the drawing is set as a front side. In the liquid processing apparatus 1, a FOUP 100 is placed in a disposition unit 11. For example, a plurality of wafers W having a diameter of 300 mm accommodated in the FOUP 100 is delivered to/from a liquid processing section 14 and a supercritical processing section 15 at a latter stage through a carry-in/out section 12 and a delivery section 13, and is sequentially carried into the liquid processing unit 2 and the supercritical processing unit 3 so that a liquid processing or a processing of removing the dry prevention liquid is performed. In the drawing, reference numeral 121 represents a first conveyance mechanism that conveys the wafer W between the FOUP 100 and the delivery section 13, and reference numeral 131 is a delivery shelf serving as a buffer in which the wafer W conveyed between the carry-in/out section 12 and the liquid processing section 14, and the supercritical processing section 15 is temporarily placed.

The liquid processing section 14 and the supercritical processing section 15 are formed across a conveyance space 162 of the wafer W. The conveyance space 162 extends in a forward-backward direction from an opening between the delivery section 13 and the conveyance space 162. For example, four liquid processing units 2 are disposed along the conveyance space 162 in the liquid processing section 14 formed at a left side of the conveyance space 162 when viewed from the front side. Meanwhile, for example, two supercritical processing units 3 are disposed along the conveyance space 162 in the supercritical processing section 15 formed at a right side of the conveyance space 162.

The wafers W are conveyed among the liquid processing units 2, the supercritical processing units 3, and the delivery section 13 by a second conveyance mechanism 161 disposed on the conveyance space 162 for the wafers. The second conveyance mechanism 161 corresponds to a substrate conveyance unit. Herein, the number of the liquid processing units 2 or the supercritical processing units 3 disposed in the liquid processing section 14 or the supercritical processing section 15 is appropriately selected according to, for example, the number of wafers W processed per unit time or a difference in processing time between the liquid processing unit 2 and the supercritical processing unit 3, and an optimal layout is selected according to, for example, the number of the liquid processing units 2 or the supercritical processing units 3 that are disposed.

Figure 2:
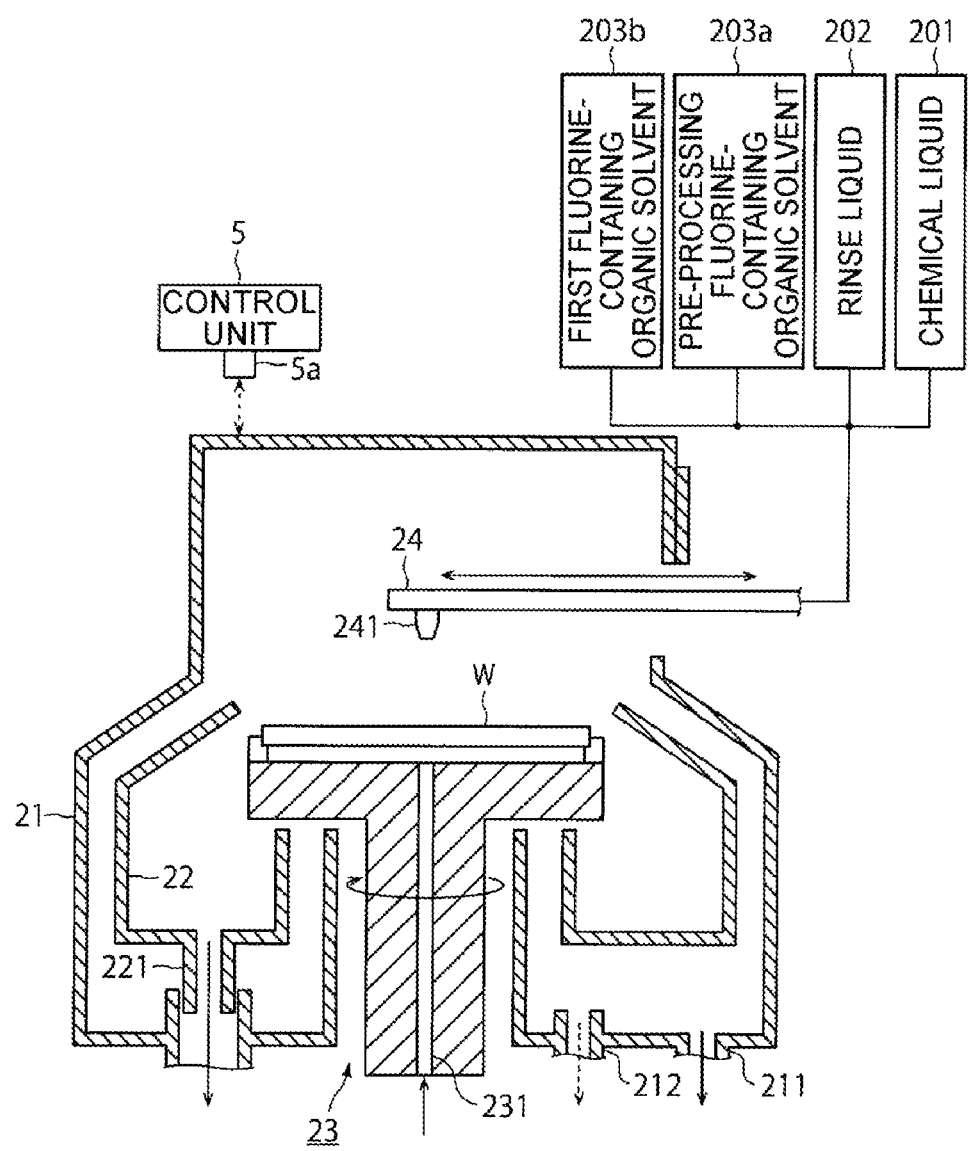
FIG. 2 is a vertical side view of a liquid processing unit installed in the liquid processing apparatus.

The liquid processing unit 2 is constituted by, for example, the single wafer-type liquid processing unit 2 that cleans the wafers W one by one by spin cleaning, and as illustrated in the vertical side view of FIG. 2, includes an outer chamber 21 that forms a processing space, a wafer holding mechanism 23 disposed in the outer chamber and configured to rotate the wafer W around a vertical axis while substantially horizontally holding the wafer W, an inner cup 22 disposed to surround the wafer holding mechanism 23 from a side circumference and configured to receive a liquid scattered from the wafer W, and a nozzle arm 24 configured to move between a position above the wafer W and a position retreated from the position above the wafer W and having a nozzle 241 provided at a distal end thereof.

A processing liquid supplying unit 201 configured to supply various chemical liquids or a rinse liquid supplying unit 202 configured to supply a rinse liquid, and a pre-processing fluorine-containing organic solvent supplying unit 203a (pre-processing organic solvent supplying unit) configured to supply a pre-processing fluorine-containing organic solvent which is the dry prevention liquid to the surface of the wafer W and a first fluorine-containing organic solvent supplying unit 203b (first organic solvent supplying unit) configured to supply a first fluorine-containing organic solvent are connected to the nozzle 241. As the pre-processing fluorine-containing organic solvent and the first fluorine-containing organic solvent, different solvents from a second fluorine-containing organic solvent used for a supercritical processing to be described below are used and further, solvents having a predetermined relationship in terms of the boiling point or threshold temperature are employed as the pre-processing fluorine-containing organic solvent, and the first fluorine-containing organic solvent and the second fluorine-containing organic solvent, but a detailed description thereof will be described below.

Further, a chemical liquid supply path 231 is formed even in the wafer holding mechanism 23 and a rear surface of the wafer W may be cleaned by the chemical liquid and the rinse liquid supplied from the chemical liquid supply path 231. An exhaust port 212 for exhausting an internal atmosphere or liquid discharge ports 221 and 211 for discharging the liquid scattered from the wafer W are formed on the bottom of the outer chamber 21 or the inner cup 22.

The pre-processing fluorine-containing organic solvent for the dry prevention and the first fluorine-containing organic solvent are supplied to the wafer W which has been subjected to a liquid processing in the liquid processing unit 2 and the wafer W is conveyed to the supercritical processing unit 3 by the second conveyance mechanism 161 with the surface of the wafer W being covered with the first fluorine-containing organic solvent. In the supercritical processing unit 3, the wafer W comes in contact with a supercritical fluid of the second fluorine-containing organic solvent so that the first fluorine-containing organic solvent is removed and the wafer W is dried. Hereinafter, a configuration of the supercritical processing unit 3 will be described with reference to FIGS. 3 and 4.

The supercritical processing unit 3 includes a processing container 3A in which the dry prevention liquid (first fluorine-containing organic solvent) attached to the surface of the wafer W is removed, and a supercritical fluid supplying unit (second organic solvent supplying unit) 4A configured to supply the supercritical fluid of the second fluorine-containing organic solvent to the processing container 3A.

Figure 4:
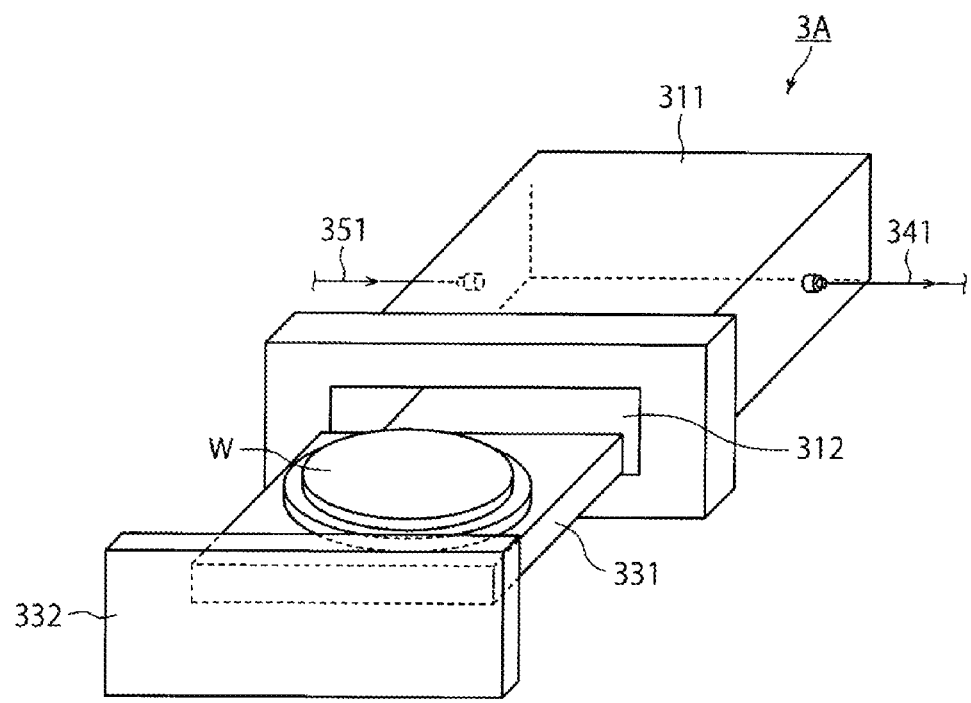
FIG. 4 is an exterior perspective view of a processing container of the supercritical processing unit.

As illustrated in FIG. 4, the processing container 3A includes a case type container body 311 formed with an opening 312 for carry-in/out of the wafer W, a wafer tray 331 capable of holding the wafer W to be processed in a transverse direction, and a cover member 332 configured to support the wafer tray 331 and seal the opening 312 when the wafer W is carried into the container body 311.

The container body 311 is, for example, a container having a processing space with a volume of approximately 200 $cm^3$ to 10000 $cm^3$, which is capable of accommodating the wafer W having a diameter of 300 mm. A supercritical fluid supply line 351 for supplying the supercritical fluid into the processing container 3A and a discharge line (discharge unit) 341 for discharging the fluid in the processing container 3A are connected to the top of the container body 311. An opening/closing valve 342 is interposed in the discharge line 341. Further, a pressing mechanism (not illustrated) configured to seal the processing space by pushing the cover member 332 toward the container body 311 against internal pressure caused by a high-pressure processing fluid supplied into the processing space is provided in the processing container 3A.

For example, a heater 322 which is a heating unit constituted by, for example, a resistance heating element, and a temperature detecting unit 323 including, for example, a thermocouple for detecting a temperature in the processing container 3A are provided in the container body 311. The temperature in the processing container 3A is heated to a predetermined temperature by heating the container body 311 and thus, the wafer W within the processing container 3A may be heated. The heater 322 may change a caloric value by changing a power supplied from a power feeding unit 321 and control the temperature in the processing container 3A to a predetermined temperature based on the temperature detection result acquired from the temperature detecting unit 323.

The supercritical fluid supplying unit 4A is connected to an upstream side of the supercritical fluid supply line 351 interposed with an opening/closing valve 352. The supercritical fluid supplying unit 4A includes a spiral pipe 411 which is a pipe for preparing the supercritical fluid of the second fluorine-containing organic solvent to be supplied to the processing container 3A, a second fluorine-containing organic solvent supplying unit 414 configured to supply the liquid of the second fluorine-containing organic solvent which is a raw material of the supercritical fluid to the spiral pipe 411, and a halogen lamp 413 configured to heat the spiral pipe 411 so that the second fluorine-containing organic solvent within the spiral pipe 411 may be placed in a supercritical state.

The spiral pipe 411 is, for example, a cylindrical container formed by spirally winding a stainless pipe member in the longitudinal direction thereof and is painted with, for example, a black radiant heat absorption paint in order to easily absorb radiant heat supplied from the halogen lamp 413. The halogen lamp 413 is disposed spaced apart from an inner wall surface of the spiral pipe 411 along a cylindrical central axis of the spiral pipe 411. A power supply unit 412 is connected to a lower end of the halogen lamp 413, and the halogen lamp 413 emits heat by a power supplied from the power supply unit 412 so that the spiral pipe 411 is heated primarily by using the radiant heat. The power supply unit 412 is connected with a temperature detecting unit (not illustrated) provided in the spiral pipe 411 and increases or decreases the power supplied to the spiral pipe 411 based on a detection temperature to heat the inside of the spiral pipe 411 at a predetermined temperature.

Further, a pipe member extends from the lower end of the spiral pipe 411 to form a reception line 415 of the second fluorine-containing organic solvent. The reception line 415 is connected to the second fluorine-containing organic solvent supplying unit 414 through an opening/closing valve 416 having pressure resistance. The second fluorine-containing organic solvent supplying unit 414 includes, for example, a tank configured to store the second fluorine-containing organic solvent in a liquid state or a liquid feeding pump, a flow rate control mechanism.

Figure 3:
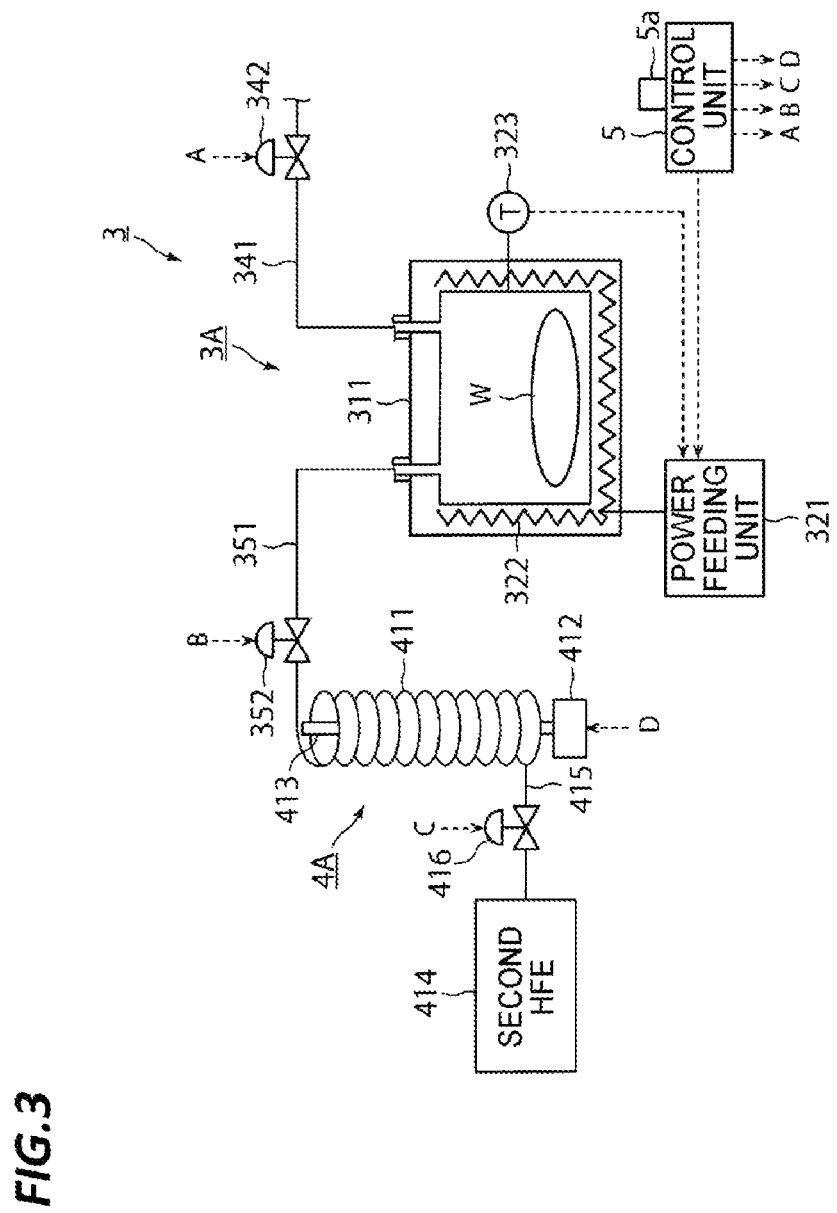
FIG. 3 is a configuration diagram of a supercritical processing unit installed in the liquid processing apparatus.

The liquid processing apparatus 1 including the liquid processing unit 2 or the supercritical processing unit 3 configured as described above is connected to a control unit 5 as illustrated in FIGS. 1 to 3. The control unit 5 is constituted by a computer including a CPU (not illustrated) and a memory unit 5a. The memory unit 5a memorizes a program in which a group of steps (commands) on a control associated with operations of the liquid processing apparatus 1 is incorporated. That is, the operations include extracting the wafer W from the FOUP 100 and performing the liquid processing of the extracted wafer W in the liquid processing unit 2 and subsequently, drying the wafer W in the supercritical processing unit 3, and carrying the wafer W into the FOUP 100. The program is stored in memory media such as, for example, a hard disk, a compact disk, a magneto optical disk, and a memory card and then installed into the computer therefrom.

Next, descriptions will be made on the pre-processing fluorine-containing organic solvent and the first fluorine-containing organic solvent supplied to the surface of the wafer W in the liquid processing unit 2, and the second fluorine-containing organic solvent supplied to the processing container 3A in the state of the supercritical fluid in order to remove the first fluorine-containing organic solvent from the surface of the wafer W. All of the pre-processing fluorine-containing organic solvent, the first fluorine-containing organic solvent, and the second fluorine-containing organic solvent are fluorine-containing organic solvents including fluorine atoms in hydrocarbon molecules.

An example of a combination of the pre-processing fluorine-containing organic solvent, the first fluorine-containing organic solvent, and the second fluorine-containing organic solvent is illustrated in Table 1.

ing some hydrogen of hydrocarbon having an ether bond in a molecule with fluorine, and hydrofluoro carbon (HFC) is a fluorine-containing organic solvent acquired by replacing some hydrogen of hydrocarbon with fluorine. Further, perfluoro carbon (PFC) is a fluorine-containing organic solvent acquired by replacing all hydrogen of hydrocarbon with fluorine and perfluoro ether (PFE) is a fluorine-containing organic solvent acquired by replacing all hydrogen of hydrocarbon having an ether bond in the molecule with fluorine.

When one fluorine-containing organic solvent is selected as the second fluorine-containing organic solvent among the fluorine-containing organic solvents, another fluorine-containing organic solvent which is higher in a boiling point (lower in vapor pressure) than the second fluorine-containing organic solvent is selected as the first fluorine-containing organic solvent. As a result, compared with the case in which the second fluorine-containing organic solvent is adopted as the dry prevention liquid, the amount of the fluorine-containing organic solvent volatilized from the surface of the wafer W may be reduced while the wafer W is conveyed to the supercritical processing unit 3 from the liquid processing unit 2.

More appropriately, a boiling point of the first fluorine-containing organic solvent may be 100° C. or higher (for example, 174° C.). Since the first fluorine-containing organic solvent having the boiling point of 100° C. or higher is smaller in a volatilization quantity during conveyance of the wafer W, the surface of the wafer W may be maintained in a wet state for approximately dozens of seconds to 10 minutes only by supplying a small amount of fluorine-containing organic solvent, that is, in a small amount of approximately 0.01 cc to 5 cc to a wafer W having a diameter of 300 mm or approximately 0.02 cc to 10 cc to a wafer W having a diameter of 450 mm. For reference, IPA needs to be supplied in an amount of approximately 10 cc to 50 cc to maintain the surface of the wafer W in the wet state for the same time as above.

TABLE 1

|  | Maker | Product Name | Class Name | Boiling Point (° C.) |
|---|---|---|---|---|
| First fluorine-containing organic solvent | Asahi Garasu Kabushiki Kaisha | AE-3000 | HFE | 56 |
|  | Asahi Garasu Kabushiki Kaisha | AC-6000 | HFC | 115 |
|  | Asahi Garasu Kabushiki Kaisha | AC-2000 | HFC | 68 |
|  | Sumitomo 3M Kabushiki Kaisha | Novec (registered trademark) 7100 | HFE | 61 |
|  | Sumitomo 3M Kabushiki Kaisha | Novec (registered trademark) 7200 | HFE | 76 |
|  | Sumitomo 3M Kabushiki Kaisha | Novec (registered trademark) 7300 | HFE | 98 |
|  | Sumitomo 3M Kabushiki Kaisha | Novec (registered trademark) 7500 | HFE | 128 |
| Second fluorine-containing organic solvent | Sumitomo 3M Kabushiki Kaisha | Fluorinert (registered trademark) FC-40 | PFC | 165 |
|  | Sumitomo 3M Kabushiki Kaisha | Fluorinert (registered trademark) FC-43 | PFC | 174 |
|  | Sumitomo 3M Kabushiki Kaisha | Fluorinert (registered trademark) FC-3283 | PFC | 128 |
|  | Solvay Solexis Kabushiki Kaisha | GALDEN (registered trademark) HT200 | PFE | 200 |
|  | Solvay Solexis Kabushiki Kaisha | GALDEN (registered trademark) | PFE | 170 |
| Supercritical processing fluorine-containing organic solvent | Sumitomo 3M Kabushiki Kaisha | Fluorinert (registered trademark) FC-72 | PFC | 56 |

Among class names of Table 1, hydrofluoro ether (HFE) is a fluorine-containing organic solvent acquired by replac- Further, when two kinds of fluorine-containing organic solvents are selected, high and low values of the boiling point correspond to high and low values of a supercritical temperature. Therefore, as for the second fluorine-containing organic solvent used as the supercritical fluid, the fluorine-containing organic solvent which is lower in a boiling point than the first fluorine-containing organic solvent is selected so that a fluorine-containing organic solvent capable of forming the supercritical fluid at a low temperature may be used and the fluorine atoms may be prevented from being released due to decomposition of the fluorine-containing organic solvent.

<Separation and Regeneration Apparatus>

Next, descriptions will be made on the separation and regeneration apparatus according to the present exemplary embodiment, which is incorporated in the substrate processing apparatus, with reference to FIGS. 5 to 7.

Figure 5:
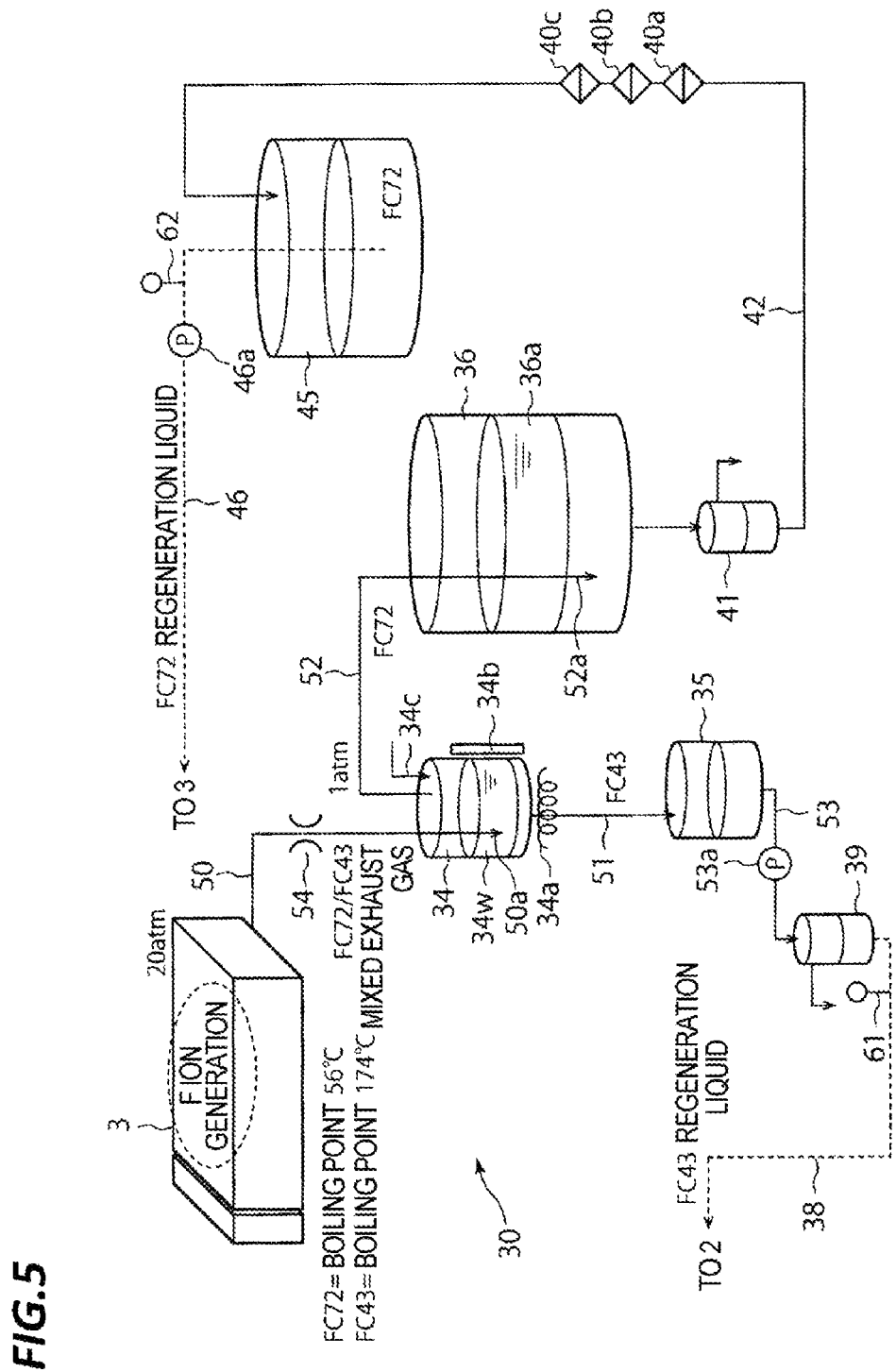
FIG. 5 is a schematic systematic diagram illustrating a separation and regeneration apparatus according to an exemplary embodiment.
Figure 6:
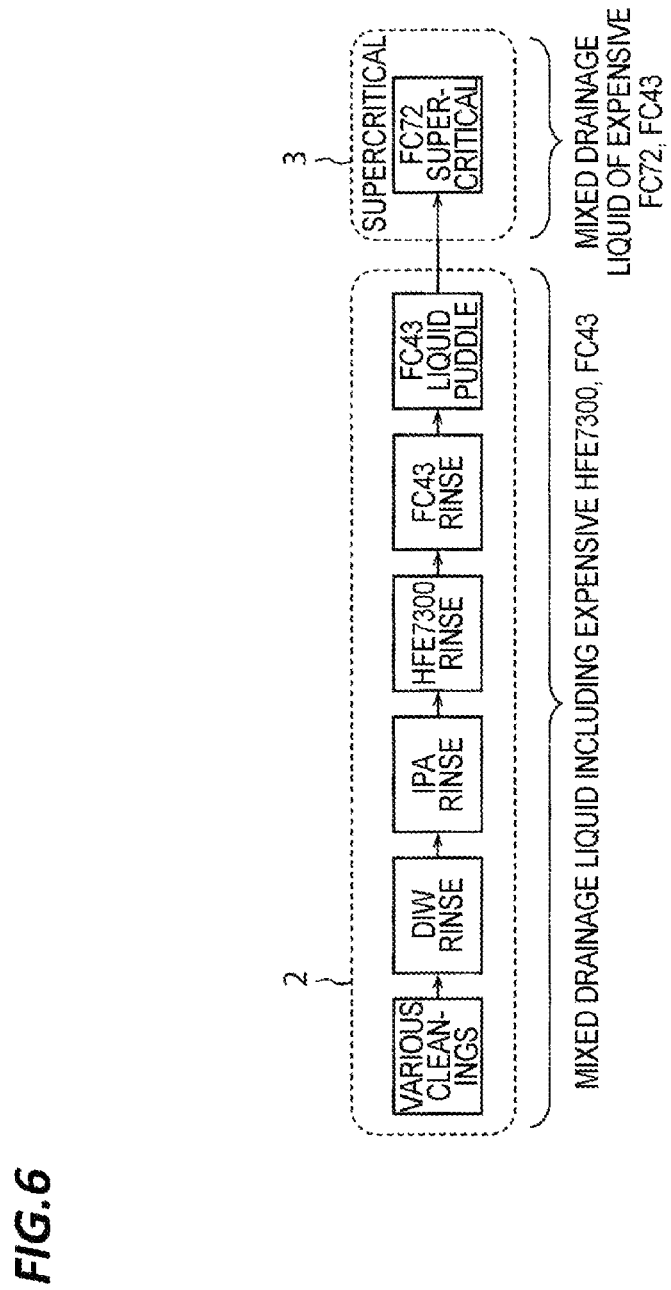
FIG. 6 is a diagram illustrating an operation sequence of the exemplary embodiment.
Figure 7:
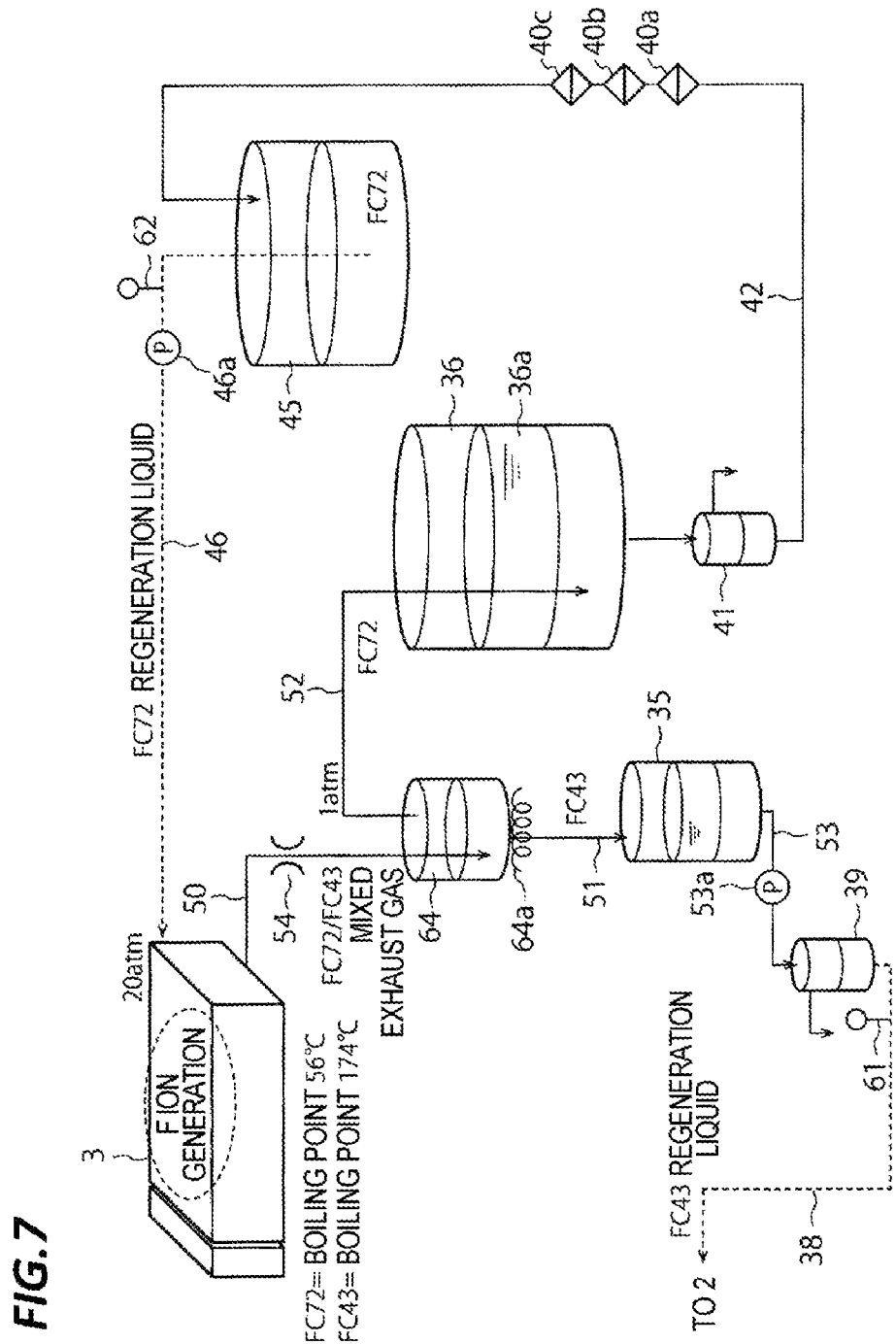
FIG. 7 is a schematic systematic diagram illustrating a separation and regeneration apparatus as a comparative example.

As illustrated in FIGS. 5 to 7, a separation and regeneration apparatus 30 includes the supercritical processing unit 3 configured to accommodate the wafer W and perform a supercritical processing on the wafer W by supplying the second fluorine-containing organic solvent to the wafer W, and a distillation tank 34 configured to heat and separate a mixed gas generated in the supercritical processing unit (mixed gas generating unit) 3.

The mixed gas generated in the supercritical processing unit 3 includes the first fluorine-containing organic solvent and the second fluorine-containing organic solvent and further, includes F ions incorporated during the supercritical processing. The mixed gas from the supercritical processing unit 3 is sent to the distillation tank 34 through an introduction line 50. Further, in the supercritical processing unit 3, the supercritical processing is performed at, for example, 20 atm and the mixed gas in the supercritical processing unit 3 is decompressed by an orifice 54 to be sent to the distillation tank 34 under the pressure of 1 atm. Meanwhile, the mixed gas from the supercritical processing unit 3 may be cooled by a cooling mechanism (not illustrated) added to the introduction line 50 or the orifice 54 and thereafter, sent to the distillation tank 34.

Hot water 34W is stored in the distillation tank 34 as described below and further, the introduction line 50 from the supercritical processing unit 3 is disposed with a distal end 50a thereof being positioned in the hot water 34W. Further, a water level gauge 34b configured to measure a water level of the hot water 34W is attached to the distillation tank 34.

The hot water 34W in the distillation tank 34 has a function to separate the mixed gas and a function to absorb and remove the F ions incorporated in the mixed gas.

The F ions may be incorporated in the mixed gas generated during the supercritical processing. When the mixed gas incorporated with the F ions, as it is, is separated and regenerated into the first fluorine-containing organic solvent and the second fluorine-containing organic solvent and the regenerated first and second fluorine-containing organic solvents are reused, particles occur on the wafer W.

According to the present exemplary embodiment, the F ions may be removed from the regenerated first and second fluorine-containing organic solvents by removing the F ions in the mixed gas by the hot water 34W in the distillation tank 34.

The distillation tank 34 separates a first fluorine-containing organic solvent (for example, FC43) having a first boiling point (for example, 174° C.) and a second fluorine-containing organic solvent (for example, FC72) having a second boiling point (for example, 56° C.) lower than the first boiling point in the mixed gas to generate a liquid type first fluorine-containing organic solvent and a gas type second fluorine-containing organic solvent, and stores the hot water 34W having a temperature (for example, 60° C. to 80° C.) between the first boiling point and the second boiling point therein, as described above.

Further, water is periodically supplied into the distillation tank 34 from a water supply line 34c and the temperature of the hot water 34W in the distillation tank 34 is maintained between the first boiling point and the second boiling point by a heater 34a as described above. In addition, the hot water 34W separates the mixed gas and removes the F ions incorporated in the mixed gas. Meanwhile, the first boiling point and the second boiling point are not limited to boiling points at atmospheric pressure. For example, when internal pressure of the distillation tank 34 is increased, the boiling point is increased as known, and as a result, the heater 34a may have a temperature between the first boiling point and the second boiling point which are changed.

Further, the liquid type first fluorine-containing organic solvent from the distillation tank 34 is sent to a first tank 35 through a supply line 51. Next, the first fluorine-containing organic solvent in the first tank is thereafter sent to a first oil-water separator 39 through a supply line 53 attached with a pump P. The first fluorine-containing organic solvent is separated into oil and water by the first oil-water separator 39.

In this case, the first fluorine-containing organic solvent of the first oil-water separator 39 includes water absorbing the F ions. In the first oil-water separator 39, the water absorbing the F ions is separated from the first fluorine-containing organic solvent.

The water absorbing the F ions in the first oil-water separator 39 is thereafter discharged to the outside, and the first fluorine-containing organic solvent separated from the water in the first oil-water separator 39 is returned to the liquid processing unit 2 through a supply line 38 as an FC43 regeneration liquid to be reused.

Meanwhile, the gas type second fluorine-containing organic solvent generated in the distillation tank 34 is sent to a second tank 36 through a supply line 52.

A water cover 36a is accommodated in the second tank 36. The gas type second fluorine-containing organic solvent is sent into the second tank 36 through the supply line 52, cooled and liquefied by the water cover 36a, and sent to a lower side of the water cover 36a from a distal end of the supply line 52 positioned at the lower side of the water cover 36a.

In the second tank 36, the liquid type second fluorine-containing organic solvent is stored at the lower side of the water cover 36a and the second fluorine-containing organic solvent in the second tank 36 is sent to a second oil-water separator 41.

The water incorporated with the F ions may be included in the second fluorine-containing organic solvent sent to the second oil-water separator 41 and the water incorporated with the F ions is separated from the second fluorine-containing organic solvent in the second oil-water separator 41.

The water incorporated with the F ions in the second oil-water separator 41 is thereafter discharged to the outside.

The second fluorine-containing organic solvent from which the water incorporated with the F ions is separated by the second oil-water separator 41 is thereafter sent to a supply tank 45 through a supply line 42.

An organic matter removing filter 40a including activated carbon, an ion removing filter 40b including activated alumina, and a particle removing filter 40c are sequentially attached to the supply line 42.

Further, the second fluorine-containing organic solvent in the supply tank 45 is returned into the supercritical processing unit 3 through a supply line 46 attached with a pump 46a as an FC72 regeneration liquid.

In addition, a first concentration meter 61 configured to measure the concentration of the first fluorine-containing organic solvent and a second concentration meter 62 configured to measure the concentration of the second fluorine-containing organic solvent are provided on the supply line 38 and the supply line 46, respectively. As for the first concentration meter 61 and the second concentration meter 62, a specific gravimeter that measures a change in specific gravity corresponding to a change in concentration or an optical measurer that measures a change in refractive index corresponding to the change in concentration may be used.

Further, components of the separation and regeneration apparatus 30, for example, the pumps 46a and 53a and the distillation tank 34 are driven and controlled by the control unit 5 having the memory unit 5a.

Operation of Exemplary Embodiment

Next, an operation of the present exemplary embodiment as configured above will be described.

In the present exemplary embodiment, descriptions will be made on the operation in a case in which HFE7300 is used as the pre-processing fluorine-containing organic solvent, FC43 is used as the first fluorine-containing organic solvent, and FC72 is used as the second fluorine-containing organic solvent.

First, the wafer W extracted from the FOUP 100 is carried into the liquid processing section 14 through the carry-in/out section 12 and the delivery section 13 and is delivered to the wafer holding mechanism 23 of the liquid processing unit 2. Continuously, various processing liquids are supplied to the surface of the wafer W which rotates to perform a liquid-processing.

As illustrated in FIG. 6, in the liquid processing, for example, particles or organic pollutant substances are removed by an SC1 liquid (a mixed liquid of ammonia and hydrogen peroxide) which is an alkaline chemical liquid and thereafter, a rinse cleaning is performed by deionized water (DIW) which is a rinse liquid.

When the liquid processing or the rinse cleaning, which uses the chemical liquid, is completed, IPA is supplied from the rinse liquid supplying unit 202 to the surface of the rotating wafer W to replace DIW which remains on the top surface and the rear surface of the wafer W. When the liquid on the surface of the wafer W is sufficiently replaced with the IPA, the pre-processing fluorine-containing organic solvent (HFE7300) is supplied to the surface of the rotating wafer W from the pre-processing fluorine-containing organic solvent supplying unit 203a and thereafter, the rotation of the wafer W stops. The surface of the wafer W of which the rotation stops is covered with the first fluorine-containing organic solvent. In this case, since the IPA has high affinity with DIW and HFE7300, and HFE7300 has high affinity with IPA and FC43, DIW may be certainly replaced with IPA and next, IPA may be certainly replaced with HFE7300. Next, HFE7300 may be easily and certainly replaced with FC43.

The wafer W on which the liquid processing has been completed is carried out from the liquid processing unit 2 by the second conveyance mechanism 161 and conveyed to the supercritical processing unit 3. Since the fluorine-containing organic solvent having the high boiling point (the low vapor pressure) is used as the first fluorine-containing organic solvent, the amount of the fluorine-containing organic solvent volatilized from the surface of the wafer W during the conveyance may be reduced.

In a period of time before the wafer W is carried into the processing container 3A, the supercritical fluid supplying unit 4A feeds a predetermined amount of liquid of the second fluorine-containing organic solvent from the second fluorine-containing organic solvent supplying unit 414 by opening the opening/closing valve 416 and thereafter, seals the spiral pipe 411 by closing the opening/closing valves 352 and 416. In this case, the liquid of the second fluorine-containing organic solvent stagnates at the lower side of the spiral pipe 411. A space is left at the upper side of the spiral pipe 411, in which the second fluorine-containing organic solvent is expanded when being evaporated by heating.

Then, when the halogen lamp 413 emits heat by initiating a power feeding from the power supply unit 412 to the halogen lamp 413, the inside of the spiral pipe 411 is heated, and as a result, the second fluorine-containing organic solvent is evaporated. Then, the temperature and pressure of the second fluorine-containing organic solvent increase to reach a threshold temperature and a threshold pressure so that the second fluorine-containing organic solvent becomes the supercritical fluid. The temperature and the pressure of the second fluorine-containing organic solvent in the spiral pipe 411 rise up to a temperature and a pressure at which the threshold temperature and the threshold pressure may be maintained when the second fluorine-containing organic solvent is supplied to the processing container 3A.

By this configuration, the wafer W of which the liquid processing has been completed and the surface is covered with the first fluorine-containing organic solvent is carried into the supercritical processing unit 3 that has been prepared to supply the supercritical fluid of the second fluorine-containing organic solvent.

When the wafer W is carried into the processing container 3A and the cover member 332 is closed to seal the processing container 3A, the supercritical fluid of the second fluorine-containing organic solvent is supplied from the supercritical fluid supplying unit 4A by opening the opening/closing valve 352 of the supercritical fluid supply line 351 before the first fluorine-containing organic solvent on the surface of the wafer W is dried.

When the supercritical fluid is supplied from the supercritical fluid supplying unit 4A and the inside of the processing container 3A is thus placed in a supercritical fluid atmosphere of the second fluorine-containing organic solvent, the opening/closing valve 352 of the supercritical fluid supply line 351 is closed. The supercritical fluid supplying unit 4A turns off the halogen lamp 413, discharges the fluid in the spiral pipe 411 through a depressurization line (not illustrated), and prepares for receiving the second fluorine-containing organic solvent in the liquid state from the second fluorine-containing organic solvent supplying unit 414 in order to prepare for the subsequent supercritical fluid.

Meanwhile, the supply of the supercritical fluid from the outside to the processing container 3A stops and the inside of the processing container 3A is sealed while being filled with the supercritical fluid of the second fluorine-containing organic solvent. In this case, when attention is focused on the surface of the wafer W in the processing container 3A, the supercritical fluid of the second fluorine-containing organic solvent is in contact with the liquid of the first fluorine-containing organic solvent that enters a pattern.

When the contact state between the liquid of the first fluorine-containing organic solvent and the supercritical fluid is maintained, the first and second fluorine-containing organic solvents which are highly miscible are mixed with each other and the liquid in the pattern is replaced with the supercritical fluid. Finally, the liquid of the first fluorine-containing organic solvent is removed from the surface of the wafer W and an atmosphere of the supercritical fluid of a mixture of the first and second fluorine-containing organic solvents is formed around the pattern. In this case, since the liquid of the first fluorine-containing organic solvent may be removed at a comparatively low temperature close to the threshold temperature of the second fluorine-containing organic solvent, the fluorine-containing organic solvent is hardly decomposed and the amount of generated hydrogen fluoride that causes damage to, for example, the pattern is also small.

By this configuration, when a time required for removing the liquid of the first fluorine-containing organic solvent from the surface of the wafer W has elapsed, the fluorine-containing organic solvent is discharged from the inside of the processing container 3A by opening the opening/closing valve 342 of the discharge line 341. In this case, for example, the amount of the heat supplied from the heater 322 is controlled so as to maintain the inside of the processing container 3A at a temperature equal to or greater than the threshold temperature of the second fluorine-containing organic solvent. As a result, the mixed fluid may be discharged in the supercritical state or in the gas state without liquefying the first fluorine-containing organic solvent having the boiling point lower than the threshold temperature of the second fluorine-containing organic solvent, and the occurrence of the pattern collapse may be prevented at the time of discharging the fluid.

When the processing by the supercritical fluid is terminated, the wafer W which is dried by removing the liquid is extracted by the second conveyance mechanism 161 and conveyed through a route opposite to that for carrying-in of the wafer W to be accommodated in the FOUP 100, and a series of processings on the wafer W is terminated. The aforementioned processing is continuously performed on the respective wafers W in the FOUP 100 in the liquid processing apparatus 1.

In the meantime, a mixed exhaust gas is generated during the supercritical processing in the supercritical processing unit 3, and the mixed exhaust gas in the supercritical processing unit 3 is sent to the distillation tank 34 through the introduction line 50.

In this case, the pressure in the supercritical processing unit 3 is set to 20 atm, the mixed exhaust gas from the supercritical processing unit 3 is decompressed by the orifice 54 to have a pressure of 1 atm. Then, the mixed exhaust gas is sent from the distal end 50a of the introduction line 50 to the hot water 34W in the distillation tank 34.

The mixed exhaust gas generated in the supercritical processing unit 3 and sent to the distillation tank 34 includes the first fluorine-containing organic solvent (FC43) having the first boiling point (174° C.) and the second fluorine-containing organic solvent (FC72) having the second boiling point (56° C.) lower than the first boiling point. Further, F ions are incorporated into the mixed gas during the supercritical processing in the supercritical processing unit 3. When the mixed gas incorporated with the F ions, as it is, is separated into the first fluorine-containing organic solvent and the second fluorine-containing organic solvent, and the first fluorine-containing organic solvent and the second fluorine-containing organic solvent are reused, particles occur on the wafer W due to the F ions.

According to the present exemplary embodiment, the F ions in the mixed gas may be effectively removed in the distillation tank 34 as described below.

Hereinafter, an operation of the distillation tank 34 will be described. The hot water 34W is stored in the distillation tank 34 and further, the introduction line 50 from the supercritical processing unit 3 is disposed with the distal end 50a being positioned in the hot water 34W.

Herein, the hot water 34W in the distillation tank 34 has a function to separate the mixed gas and a function to absorb and remove the F ions incorporated in the mixed gas.

That is, the F ions are incorporated in the mixed gas generated during the supercritical processing, but the F ions in the mixed gas may be removed by the hot water 34W in the distillation tank 34 so that the F ions may be eliminated from the regenerated first and second fluorine-containing organic solvents.

Further, since the hot water 34W in the distillation tank 34 has the temperature (for example, 60° C. to 80° C.) between the first boiling point (174° C.) of the first fluorine-containing organic solvent (for example, FC43) and the second boiling point (56° C.) of the second fluorine-containing organic solvent (for example, FC72), the mixed gas may be effectively separated into the liquid type first fluorine-containing organic substance and the gas type second fluorine-containing organic substance by the hot water 34W.

In the meantime, water is periodically supplied from the water supply line 34c into the distillation tank 34 and the hot water 34W in the distillation tank 34 is maintained at a temperature between the first boiling point and the second boiling point by the heater 34a. By this configuration, due to the hot water 34W, the mixed gas may be separated and the F ions incorporated into the mixed gas may be removed. Meanwhile, the first boiling point and the second boiling point are not limited to boiling points at the atmospheric pressure. For example, when the internal pressure of the distillation tank 34 is increased, the boiling point is increased as known, and as a result, the heater 34a may have a temperature between the first boiling point and the second boiling point which are changed.

Next, the liquid type first fluorine-containing organic solvent from the distillation tank 34 is sent to the first tank 35 through the supply line 51. Next, the first fluorine-containing organic solvent in the first tank is thereafter sent to the first oil-water separator 39 through the supply line 53 attached with the pump P. The first fluorine-containing organic solvent is separated into oil and water by the first oil-water separator 39.

In this case, the first fluorine-containing organic solvent of the first oil-water separator 39 includes water absorbing the F ions. In the first oil-water separator 39, the water absorbing the F ions is separated from the first fluorine-containing organic solvent.

The water absorbing the F ions in the first oil-water separator 39 is thereafter discharged to the outside and the first fluorine-containing organic solvent separated from the water in the first oil-water separator 39 is returned to the liquid processing unit 2 through the supply line 38 as an FC 43 regeneration liquid to be reused.

Meanwhile, the gas type second fluorine-containing organic solvent generated in the distillation tank 34 is sent to the second tank 36 through the supply line 52.

The water cover 36a is accommodated in the second tank 36. The gas type second fluorine-containing organic solvent is sent into the second tank 36 through the supply line 52, cooled and liquefied by the water cover 36a, and sent to the lower side of the water cover 36*a* from a distal end of the supply line 52 positioned at the lower side of the water cover 36*a*.

In the meantime, an organic substance in the second tank 36 is discharged to the outside from the upper side of the second tank 36 as organic exhaust gas.

In the second tank 36, the liquid type second fluorine-containing organic solvent is stored at the lower side of the water cover 36*a* and the second fluorine-containing organic solvent in the second tank 36 is sent to the second oil-water separator 41.

The water incorporated with the F ions may be included in the second fluorine-containing organic solvent sent to the second oil-water separator 41 and the water incorporated with the F ions is separated from the second fluorine-containing organic solvent in the second oil-water separator 41.

The water incorporated with the F ions in the second oil-water separator 41 is thereafter discharged to the outside.

The second fluorine-containing organic solvent from which the water incorporated with the F ions is separated by the second oil-water separator 41 is thereafter sent to the supply tank 45 through the supply line 42.

Next, the second fluorine-containing organic solvent in the supply tank 45 is returned into the supercritical processing unit 3 through the supply line 46 attached with the pump 46*a* as the FC72 regeneration liquid.

Next, a separation and regeneration apparatus as a comparative example of the present exemplary embodiment will be described with reference to FIG. 7. In the comparative example illustrated in FIG. 7, a distillation tank 64 that has a heater 64*a* and does not include hot water is provided instead of the distillation tank 34 which stores the hot water 34W.

In the comparative example illustrated in FIG. 7, other components are almost the same as those in the present exemplary embodiment illustrated in FIG. 5.

In the comparative example illustrated in FIG. 7, a mixed gas sent to the distillation tank 64 is heated by the heater of the distillation tank 64 to be separated into the first fluorine-containing organic solvent (FC43) and the second fluorine-containing organic solvent (FC72). However, F ions in the mixed gas are not removed in the distillation tank 64.

Contrary to this, according to the present exemplary embodiment, since the hot water 34W is stored in the distillation tank 34, the F ions in the mixed gas may be effectively removed by the hot water 34W and further, the mixed gas may be certainly separated into the first fluorine-containing organic solvent and the second fluorine-containing organic solvent.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A separation and regeneration apparatus comprising:
    a controller including a processor coupled with a memory;
    a mixed gas generating unit configured to receive a wafer covered with a first fluorine-containing organic solvent having a first boiling point;
    a supercritical fluid supply line connecting to the mixed gas generating unit, the supercritical fluid supply line being provided with a first valve;
    a discharge line connected to the mixed gas generating unit and including a second valve; and
    a distillation tank configured to store hot water, the distillation tank including:
        a water supply line that allows for periodic supply of water into the distillation tank,
        a water level gauge configured to measure a level of the hot water within the distillation tank,
        a distillation tank heater, and
        an introduction line connected to the discharge line and running between the mixed gas generating unit and the distillation tank, the introduction line terminating in the distillation tank,
    wherein the controller is programmed to:
        control a mixed gas generating unit heater that heats the mixed gas generating unit to a predetermined temperature;
        control the distillation tank heater to maintain the water within the distillation tank at a temperature between the first boiling point and the second boiling point,
        open the first valve of the supercritical fluid supply line so as to introduce a second fluorine-containing organic solvent having a second boiling point lower than the first boiling point from the supercritical fluid supply line into the mixed gas generating unit, such that a mixed gas is generated from the first fluorine-containing organic solvent covering the wafer and the second fluorine-containing organic solvent introduced from the supercritical fluid supply line; and
        close the first valve of the supercritical fluid supply line and open the second valve of the discharge line so as to discharge the mixed gas from the mixed gas generating unit to the distillation tank through the discharge line such that the mixed gas is conveyed into the hot water within the distillation tank through the introduction line to be separated into a liquid state of the first fluorine-containing organic solvent, a gaseous state of the second fluorine-containing organic solvent, and F ions that will be incorporated into the hot water.

2. The separation and regeneration apparatus of claim 1, further comprising:
    a first tank configured to store the first fluorine-containing organic solvent from the distillation tank; and
    a second tank configured to liquefy and store the second fluorine-containing organic solvent from the distillation tank.

3. The separation and regeneration apparatus of claim 2, wherein the second tank accommodates a water cover configured to cover the second fluorine-containing organic solvent therein.

4. The separation and regeneration apparatus of claim 1, wherein a first oil-water separator and a second oil-water separator are connected to the first tank and the second tank, respectively.

5. The separation and regeneration apparatus of claim 1, wherein the mixed gas generating unit includes a supercritical processing unit configured to perform a supercritical processing on a processing target object.

6. The separation and regeneration apparatus of claim 5, wherein the supercritical processing unit includes:
    a second fluorine-containing organic solvent supply source;
    a spiral pipe in which the second fluorine-containing organic solvent is supplied from the second fluorine-containing organic solvent supply source; and a lamp provided inside the spiral pipe and configured to heat the spiral pipe such that the second fluorine-containing organic solvent supplied within the spiral pipe is placed in a supercritical state.

7. The separation and regeneration apparatus of claim 1, wherein the controller is programmed to control the mixed gas generating unit heater by controlling the power feeding unit that supplies power to the heater.

8. A substrate processing apparatus comprising:
a liquid processing unit configured to supply a first fluorine-containing organic solvent having a first boiling point to a processing target object to perform a liquid processing;
a supercritical processing unit configured to bring a liquid of the first fluorine-containing organic solvent attached to the processing target object after the liquid processing into contact with a supercritical fluid of a second fluorine-containing organic solvent having a second boiling point lower than the first boiling point to remove the liquid; and
a substrate conveyance unit configured to convey the processing target object which has been subjected to the liquid processing in the liquid processing unit to the supercritical processing unit,
wherein the separation and regeneration apparatus of claim 1 is included in the supercritical processing unit.

* * * * *